United States Patent
Chen et al.

(10) Patent No.: US 8,362,689 B2
(45) Date of Patent: Jan. 29, 2013

(54) PHOSPHORS AND LIGHT-EMITTING DEVICES USING THE SAME

(75) Inventors: Teng-Ming Chen, Hsinchu (TW); Te-Wen Kuo, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 13 days.

(21) Appl. No.: 13/021,393

(22) Filed: Feb. 4, 2011

(65) Prior Publication Data
US 2012/0146486 A1 Jun. 14, 2012

(30) Foreign Application Priority Data
Dec. 8, 2010 (TW) .............................. 99142766 A

(51) Int. Cl.
*H01J 1/62* (2006.01)
*H01J 63/04* (2006.01)
(52) U.S. Cl. ........ 313/503; 313/498; 313/512; 313/486; 252/301.4 R; 252/301.4 S; 252/301.4 F
(58) Field of Classification Search .......... 313/498–512, 313/483, 485, 486, 467; 252/301.4 R, 301.4 S, 252/301.4 F
See application file for complete search history.

(56) References Cited

U.S. PATENT DOCUMENTS

| | | | | |
|---|---|---|---|---|
| 2004/0007961 A1* | 1/2004 | Srivastava et al. | ............ | 313/486 |
| 2009/0085458 A1* | 4/2009 | Murazaki et al. | ............ | 313/487 |
| 2009/0096361 A1* | 4/2009 | Fukuda et al. | ............ | 313/504 |
| 2009/0295272 A1* | 12/2009 | Oshio | ............ | 313/503 |
| 2011/0235309 A1* | 9/2011 | Miki et al. | ............ | 362/97.2 |

FOREIGN PATENT DOCUMENTS

| CN | 100564478 | 12/2007 |
|---|---|---|
| EP | 2100943 A1 | 9/2009 |
| WO | WO 2009/109382 A1 | 9/2009 |

OTHER PUBLICATIONS

Brenchley, Matthew E. et al., "Synthesis and Structure of Sulfide Aluminate Sodalites", J. Mater Chem.; Jun. 10, 1992, pp. 1003-1005; 2(10).
Zhang, Xinmin et al., "Luminescent properties of $Eu^{2+}$-activated $SrLaGa_3S_6O$ phosphor" Journal of Alloys and Compounds; Jun. 18, 2004; pp. 247-251.
Jung, Sang Hyun et al., "Synthesis and Phase Transformation of $Ca_{10}(PO_4)_6S$ Sulfoapatite by Solid-state Reaction with Sulfor Vapor", Synthesis and Reactivity in Inorganic, Metal-Organic, and Nano-Metal Chemistry; 2008; pp. 303-306.
Kuo, Te-Wen et al.; "Novel yellowish-orange $Sr_8AL_{12}O_{24}S_2$:$Eu^{2+}$ phosphor for application in blue light-emitting diode based white LED"; Optical Society of America; Jun. 21, 2010, vol. 18, No. 102.

* cited by examiner

*Primary Examiner* — Anh T. Mai
*Assistant Examiner* — Kevin Quarterman
(74) *Attorney, Agent, or Firm* — Muncy, Geissler, Olds & Lowe, PLLC

(57) ABSTRACT

The present invention relates to novel phosphors, which are represented by a formula of $(A_{1-x}M_x)_8D_{12}O_{24}S_2$, wherein x, A, M and D are defined the same as the specification. In addition, the present invention further provides a light-emitting device using the above novel phosphors.

17 Claims, 6 Drawing Sheets

PHOSPHORS AND LIGHT-EMITTING DEVICES USING THE SAME

CROSS REFERENCE TO RELATED APPLICATION

This application claims the benefits of the Taiwan Patent Application Serial Number 099142766, filed on Dec. 8, 2010, the subject matter of which is incorporated herein by reference.

BACKGROUND OF THE INVENTION

1. Field of the Invention

The present invention relates to novel phosphors and light-emitting devices using the same and, more particularly, to novel phosphors capable of being excited by blue light or UV light and light-emitting devices using the same.

2. Description of Related Art

Phosphors have been applied in lighting devices and display devices for a half century. Taking the most widely used fluorescent lamps for example, phosphors applied therein can be excited by mercury radiation as excitation light and then emit visible light. The light color emitted from a fluorescent lamp can be modified by mixing various phosphors and wide range of color temperature and color rendering characteristics for light output can be achieved, resulting in its wide application. However, most of commonly used three-basal-color phosphors have disadvantages of high cost due to that these phosphors often use limited reserves of rare elements (such as Eu, Ce, Tb etc.) as raw materials.

Recently, white light-emitting diodes (W-LEDs) also have been actively developed due to their high luminescence efficiency, low power consumption, long lifetime and environment friendly features in comparison with traditional lighting devices and thus are considered most potential to replace fluorescent lamps. For white light-emitting diodes, the methods of making white light include: as a first type, mixing light from red, green and blue LED chips in a white light-emitting module; as a second type, mixing light from a blue LED chip and yellow YAG phosphors that can be excited by the blue LED chip; and as a third type, mixing light from red, green and blue phosphors that are mixed with an optically transparent resin and can be excited by an UV LED.

Most of commercially available white LEDs apply the above-mentioned second method to emit white light. However, the second technology was claimed for a patent by Nichia. Accordingly, it is necessary to develop novel materials to overcome patent barrier.

SUMMARY OF THE INVENTION

The object of the present invention is to provide novel phosphors. Regarding the novel phosphors of the present invention, non-rare elements may be used as an active center to resolve the high cost issue resulting from conventional mercury radiation-excitable phosphors using rare elements, or rare elements may be used as an active center to allow the phosphors to be applied in a mercury-free light-emitting device (such as LEDs).

To achieve the object, the present invention provides a phosphor represented by a chemical formula of $(A_{1-x}M_x)_8D_{12}O_{24}S_2$, in which $0<x<1$; A is selected from the group consisting of Mg, Ca, Sr, Ba, Zn and a combination thereof; M is selected from the group consisting of Mn, Cu, Ag, Pb, Sb, Sn, Bi, Eu, Ce, Tb, Sm, Pr, Y, La, Gd, Lu, Sc, Nd, Pm, Dy, Ho, Er, Tm, Yb and a combination thereof; and D is selected from the group consisting of B, Al, Ga, In and a combination thereof.

According to one aspect of the present invention, A may be Ca, Sr or a combination thereof, M may be Mn, and preferably $0<x<0.05$, more preferably $0.0025 \leq x \leq 0.02$. In this aspect, the phosphors use a transition metal element as an active center and can be excited by UV light. Hence, the phosphors according to this aspect can be fabricated in low cost in comparison with conventional mercury radiation-excitable phosphors that use rare elements. Specifically, $(Ca_{1-x}Mn_x)_8Al_{12}O_{24}S_2$ and $(Sr_{1-x}M_x)_8Al_{12}O_{24}S_2$ can be used as a blue phosphor material and a green phosphor material, respectively, and can be excited by UV light that ranges from about 250 nm to 300 nm in wavelength. Thereby, the phosphors according to this aspect can be applied in light-emitting devices with UV excitation.

In another aspect of the present invention, A may be Sr, M may be Eu, and preferably $0<x<0.3$, more preferably $0.02 \leq x \leq 0.14$. The phosphors according to this aspect uses rare elements as an active center and can be excited by blue light that ranges from about 420 nm to 490 nm in wavelength. Thereby, the phosphors according to this aspect may be applied in mercury free light-emitting devices. In particular, the light emitted by the phosphors according to this aspect can be mixed with blue light to form white light, and thus the phosphors according to this aspect have the potential to replace YAG phosphors provided by Nichia.

The present invention further applies the above-mentioned phosphors in light-emitting devices. Accordingly, the present invention further provides a light-emitting device, including: an excitation unit for providing excitation light; and a phosphor layer capable of emitting visible light upon being excited by the excitation light, therewith the phosphor layer including phosphor(s) represented by a chemical formula of $(A_{1-x}M_x)_8D_{12}O_{24}S_2$, in which $0<x<1$; A is selected from the group consisting of Mg, Ca, Sr, Ba, Zn and a combination thereof; M is selected from the group consisting of Mn, Cu, Ag, Pb, Sb, Sn, Bi, Eu, Ce, Tb, Sm, Pr, Y, La, Gd, Lu, Sc, Nd, Pm, Dy, Ho, Er, Tm, Yb and a combination thereof; and D is selected from the group consisting of B, Al, Ga, In and a combination thereof.

In one aspect according to the present invention, an UV excitation unit, which can emit light of about 250 nm to 300 nm in wavelength, is used as the excitation unit. Additionally, according to the aspect, A may be Ca, Sr or a combination thereof, M may be Mn, and preferably $0<x<0.05$, more preferably $0.0025 \leq x \leq 0.02$. More specifically, the light-emitting device according to the aspect may use $(Ca_{1-x}Mn_x)_8Al_{12}O_{24}S_2$ and $(Sr_{1-x}Mn_x)_8Al_{12}O_{24}S_2$ as a blue phosphor material and a green phosphor material, respectively. Herein, the UV excitation unit may be any conventional devices capable of emitting UV light. For example, the UV excitation unit may include: a housing body provided with a cathode electrode and an anode electrode, therewith the phosphor layer being disposed on an inner wall of the housing body; and a discharge medium contained in the housing body for emitting the excitation light.

In the present invention, the housing body may be a transparent sealed tube and the discharge medium may include mercury and inert gas.

In another aspect according to the present invention, a blue excitation unit, which can emit light of about 420 nm to 490 nm in wavelength, is used as the excitation unit. Additionally, according to the aspect, A may be Sr, M may be Eu, and preferably $0<x<0.3$, more preferably $0.02 \leq x \leq 0.14$. Herein, the blue excitation unit may be any conventional devices capable of emitting blue light. For example, the blue excitation unit may include: a carrier provided with a cathode electrode and an anode electrode; a blue light-emitting component disposed on the carrier and electrically connected with the cathode electrode and the anode electrode, therewith the phosphor layer covering the blue light-emitting component.

In the present invention, the carrier is not particularly limited and may be a circuit substrate or a packaging base with lead frames. In addition, the blue light-emitting component is not particularly limited and may be a blue LED chip.

Accordingly, the novel phosphors provided by the present invention may use non-rare elements as an active center to resolve the high cost issue resulting from conventional mercury radiation-excitable phosphors using rare elements, or uses rare elements as an active center to allow the phosphors to be applied in a mercury-free light-emitting device (such as LEDs) and replace YAG phosphors provided by Nichia.

DETAILED DESCRIPTION OF THE PREFERRED EMBODIMENT

Hereafter, examples will be provided to illustrate the embodiments of the present invention. Other advantages and effects of the invention will become more apparent from the disclosure of the present invention. It should be noted that these accompanying figures are simplified. The quantity, shape and size of components shown in the figures may be modified according to practically conditions, and the arrangement of components may be more complex. Other various aspects also may be practiced or applied in the invention, and various modifications and variations can be made without departing from the spirit of the invention based on various concepts and applications.

PREPARATION EXAMPLES 1 to 5

According to Table 1, a stoichiometric mixture of $CaCO_3$, $CaSO_4$, $Al_2O_3$ and MnO was ground together for 10 minutes and then put into a crucible to perform a sintering process in a furnace at about 1100° C. to 1400° C. for about 4 to 8 hours so as to obtain a product of $(Ca_{1-x}Mn_x)_{64}[Al_{96}O_{192}](SO_4)_{16}$. The as-obtained product was ground for 5 minutes and then heated under $N_2$ atmosphere at about 800° C. to 1000° C. for about 4 to 8 hours so as to obtain the phosphor material of $(Ca_{1-x}Mn_x)_8Al_{12}O_{24}S_2$. The reaction equation is shown as follows:

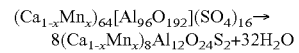

$(Ca_{1-x}Mn_x)_{64}[Al_{96}O_{192}](SO_4)_{16} \rightarrow 8(Ca_{1-x}Mn_x)_8Al_{12}O_{24}S_2 + 32H_2O$

TABLE 1

| | | $CaCO_3:CaSO_4:Al_2O_3$:MnO (molar ratio) | | | |
|---|---|---|---|---|---|
| | x | $CaCO_3$ (g) | $CaSO_4$ (g) | $Al_2O_3$ (g) | MnO (g) |
| Preparation Example 1 | 0.0025 | 0.4784 | 47.84:16:48:0.16 0.2176 | 0.4896 | 0.001125 |
| Preparation Example 2 | 0.005 | 0.4768 | 47.68:16:48:0.32 0.2176 | 0.4896 | 0.00225 |
| Preparation Example 3 | 0.01 | 0.4736 | 47.36:16:48:0.64 0.2176 | 0.4896 | 0.0045 |
| Preparation Example 4 | 0.015 | 0.4704 | 47.04:16:48:0.96 0.2176 | 0.4896 | 0.00675 |
| Preparation Example 5 | 0.02 | 0.4672 | 46.72:16:48:1.28 0.2176 | 0.4896 | 0.009 |

Figure 1:
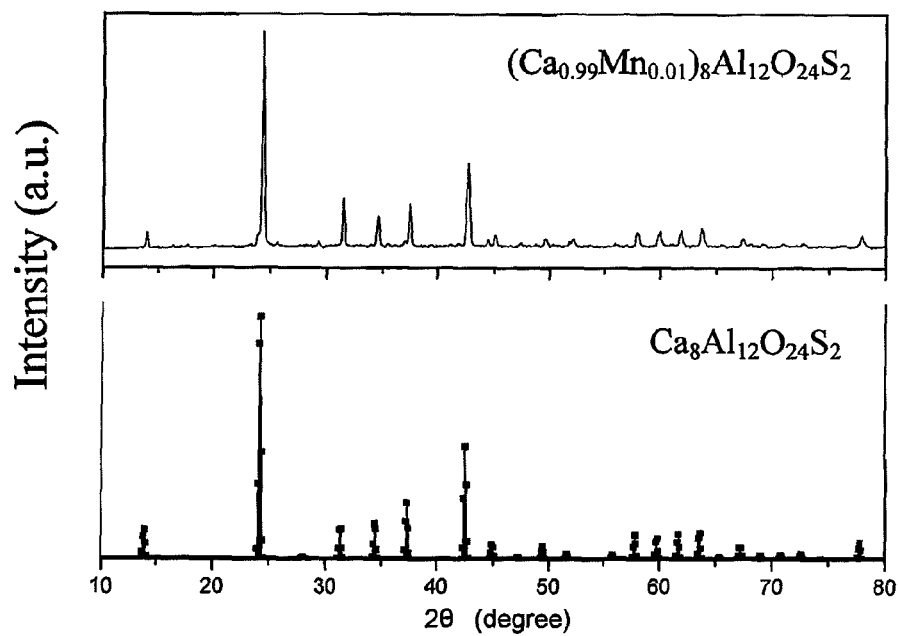
FIG. 1 shows XRD spectra of the $(Ca_{0.99}Mn_{0.01})_8Al_{12}O_{24}S_2$ phosphor prepared by the preparation example 3 according to the present invention and $Ca_8Al_{12}O_{24}S_2$.

The phosphors prepared from Preparation Examples 1 to 5 were verified by powder X-ray diffraction analysis with an automatic diffractometer (Broker AXS D8 Advance) with a Cu target, in which the Cu target was bombarded by an electron beam and then emitted characteristic X-ray. FIG. 1 shows the XRD patterns of the $(Ca_{1-x}Mn_x)_8Al_{12}O_{24}S_2$ phosphor, in which the upper diagram shows signal patterns of $(Ca_{0.99}Mn_{0.01})_8Al_{12}O_{24}S_2$ and the lower diagram shows signal patterns of $Ca_8Al_{12}O_{24}S_2$. The XRD spectra of phosphors with various doping concentrations (x=0.0025, 0.005, 0.015, 0.02) are the same as the upper diagram in FIG. 1.

PREPARATION EXAMPLES 6 to 12

According to Table 2, a stoichiometric mixture of $SrCO_3$, $SrSO_4$, $Al_2O_3$ and $Eu_2O_3$ was ground together for 10 minutes and then put into a crucible to perform a sintering process in a furnace at about 1100° C. to 1400° C. for about 4 to 8 hours so as to obtain a product of $(Sr_{1-x}Eu_x)_{64}[Al_{96}O_{192}](SO_4)_{16}$. The as-obtained product was ground for 5 minutes and then heated under $N_2$ atmosphere at about 800° C. to 1000° C. for about 4 to 8 hours so as to obtain the phosphor material of $(Sr_{1-x}Eu_x)_8Al_{12}O_{24}S_2$. The reaction equation is shown as follows:

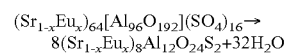

$(Sr_{1-x}Eu_x)_{64}[Al_{96}O_{192}](SO_4)_{16} \rightarrow 8(Sr_{1-x}Eu_x)_8Al_{12}O_{24}S_2 + 32H_2O$

TABLE 2

| | x | SrCO$_3$:SrSO$_4$:Al$_2$O$_3$:Eu$_2$O$_3$ (molar ratio) | | | |
| --- | --- | --- | --- | --- | --- |
| | | SrCO$_3$ (g) | SrSO$_4$ (g) | Al$_2$O$_3$ (g) | Eu$_2$O$_3$ (g) |
| Preparation Example 6 | 0.02 | 0.3448 | 46.72:16:48:0.64 0.1469 | 0.2448 | 0.01125 |
| Preparation Example 7 | 0.04 | 0.3354 | 45.44:16:48:1.28 0.1469 | 0.2448 | 0.0225 |
| Preparation Example 8 | 0.06 | 0.3259 | 44.16:16:48:1.92 0.1469 | 0.2448 | 0.03375 |
| Preparation Example 9 | 0.08 | 0.3165 | 42.88:16:48:2.56 0.1469 | 0.2448 | 0.0450 |
| Preparation Example 10 | 0.10 | 0.3071 | 41.6:16:48:3.2 0.1469 | 0.2448 | 0.05625 |
| Preparation Example 11 | 0.12 | 0.2976 | 40.32:16:48:3.84 0.1469 | 0.2448 | 0.0675 |
| Preparation Example 12 | 0.14 | 0.2882 | 39.04:16:48:4.48 0.1469 | 0.2448 | 0.07875 |

Figure 2:
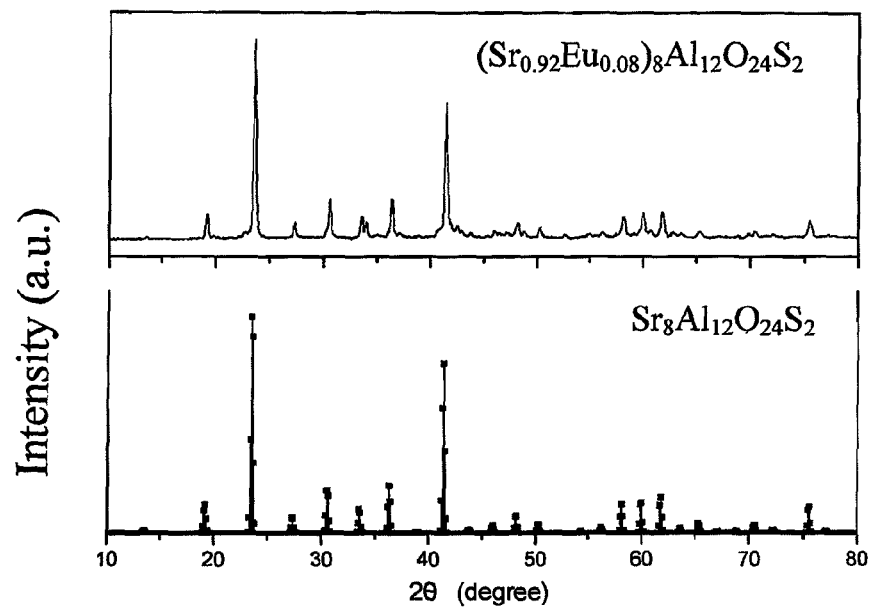
FIG. 2 shows XRD spectra of the $(Sr_{0.92}Eu_{0.08})_8Al_{12}O_{24}S_2$ phosphor prepared by the preparation example 9 according to the present invention and $Sr_8Al_{12}O_{24}$.

The phosphors prepared from Preparation Examples 11 to 12 were verified by powder X-ray diffraction analysis with an automatic diffractometer (Broker AXS D8 Advance) with a Cu target, in which the Cu target was bombarded by an electron beam and then emitted characteristic X-ray. FIG. 2 shows the XRD patterns of the $(Sr_{1-x}Eu_x)_8Al_{12}O_{24}S_2$ phosphor, in which the upper diagram shows signal patterns of $(Sr_{0.98}Eu_{0.02})_8Al_{12}O_{24}S_2$ and the lower diagram shows signal patterns of $Sr_8Al_{12}O_{24}S_2$. The XRD spectra of phosphors with various doping concentrations (x=0.02, 0.04, 0.06, 0.10, 0.12, 0.14) are the same as the upper diagram in FIG. 2.

PREPARATION EXAMPLES 13 to 17

According to Table 3, a stoichiometric mixture of SrCO$_3$, SrSO$_4$, Al$_2$O$_3$ and MnO was ground together for 10 minutes and then put into a crucible to perform a sintering process in a furnace at about 1100° C. to 1400° C. for about 4 to 8 hours so as to obtain a product of $(Sr_{1-x}Mn_x)_{64}[Al_{96}O_{192}](SO_4)_{16}$. The as-obtained product was ground for 5 minutes and then heated under N$_2$ atmosphere at about 800° C. to 1000° C. for about 4 to 8 hours so as to obtain the phosphor material of $(Sr_{1-x}Mn_x)_8Al_{12}O_{24}S_2$. The reaction equation is shown as follows:

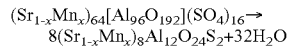

$(Sr_{1-x}Mn_x)_{64}[Al_{96}O_{192}](SO_4)_{16} \rightarrow$
$8(Sr_{1-x}Mn_x)_8Al_{12}O_{24}S_2 + 32H_2O$

TABLE 3

| | x | SrCO$_3$:SrSO$_4$:Al$_2$O$_3$:MnO (molar ratio) | | | |
| --- | --- | --- | --- | --- | --- |
| | | SrCO$_3$ (g) | SrSO$_4$ (g) | Al$_2$O$_3$ (g) | MnO (g) |
| Preparation Example 13 | 0.0025 | 0.3531 | 47.84:16:48:0.16 0.1469 | 0.2448 | 0.000575 |
| Preparation Example 14 | 0.005 | 0.3520 | 47.68:16:48:0.32 0.1469 | 0.2448 | 0.00115 |
| Preparation Example 15 | 0.01 | 0.3496 | 47.36:16:48:0.64 0.1469 | 0.2448 | 0.0023 |
| Preparation Example 16 | 0.015 | 0.3472 | 47.04:16:48:0.96 0.1469 | 0.2448 | 0.00345 |
| Preparation Example 17 | 0.02 | 0.3449 | 46.72:16:48:1.28 0.1469 | 0.2448 | 0.0046 |

The phosphors prepared from Preparation Examples 13 to 17 were verified by powder X-ray diffraction analysis with an automatic diffractometer (Bruker AXS D8 Advance) with a Cu target, in which the Cu target was bombarded by an electron beam and then emitted characteristic X-ray. The XRD spectra of $(Sr_{1-x}Mn_x)_8Al_{12}O_{24}S_2$ phosphors are the same as FIG. 2.

TEST EXAMPLE 1

The emission measurements of $(Ca_{1-x}Mn_x)_8Al_{12}O_{24}S_2$ phosphors were performed by using a Spex Fluorolog-3 spectrofluorometer (Instruments S.A., Edison, N.J., USA) equipped with a 450 W Xe light source and double excitation monochromators. In addition, a DT-100 Color Analyzer was used for the measurement of CIE chromaticity coordinates (x, y).

Figure 3:
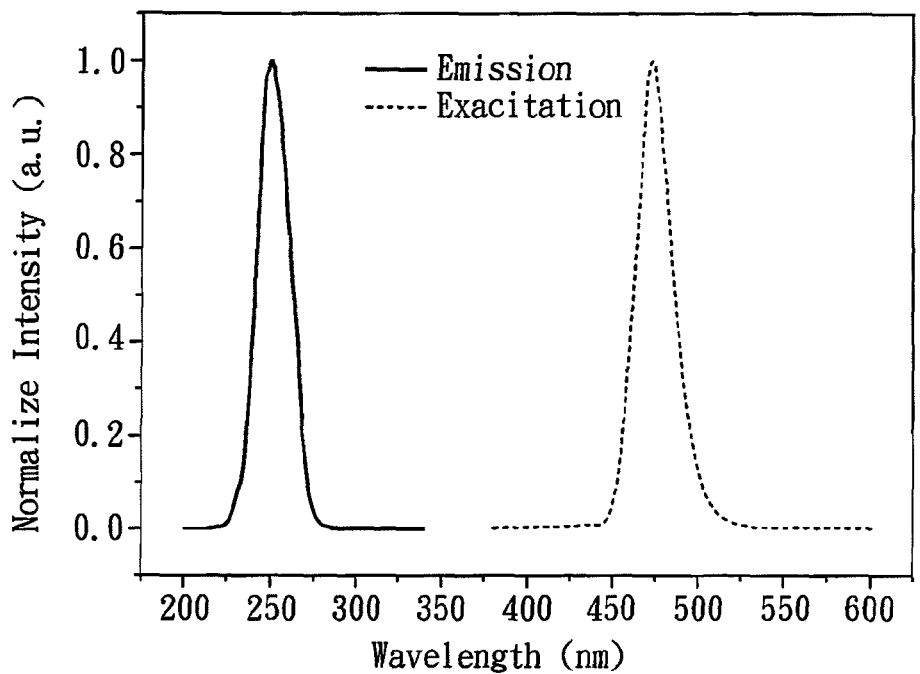
FIG. 3 shows the photoluminescence (PL) and photoluminescence excitation (PLE) spectra of $(Ca_{0.99}Mn_{0.01})_8Al_{12}O_{24}S_2$ phosphor prepared by the preparation example 3 according to the present invention.
Figure 4:
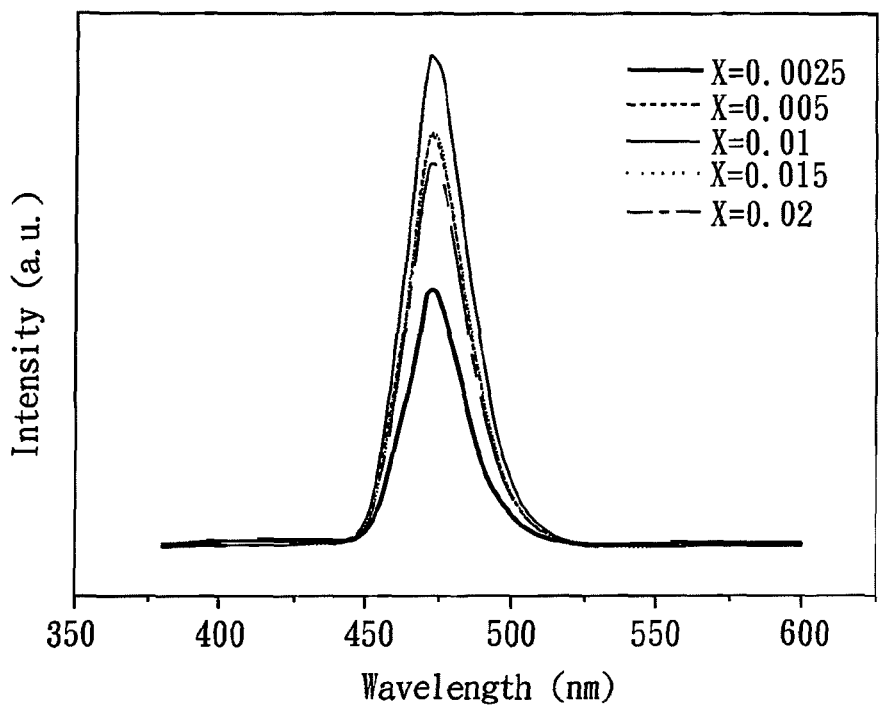
FIG. 4 shows an emission intensity as a function of Mn concentration (x) for $(Ca_{1-x}Mn_x)_8Al_{12}O_{24}S_2$ phosphors prepared by the preparation examples 1-5 according to the present invention.

FIG. 3 shows the photoluminescence (PL) and photoluminescence excitation (PLE) spectra of $(Ca_{0.99}Mn_{0.01})_8Al_{12}O_{24}S_2$ phosphor. It shows that the excitation wavelength is about 254 nm and the emission wavelength is about 476 nm for $(Ca_{1-x}Mn_x)_8Al_{12}O_{24}S_2$ phosphor. FIG. 4 shows an emission intensity as a function of Mn concentration (x) for $(Ca_{1-x}Mn_x)_8Al_{12}O_{24}S_2$ phosphors. Additionally, the cm chromaticity coordinate of $(Ca_{0.99}Mn_{0.01})_8Al_{12}O_{24}S_2$ phosphor is (0.12, 0.11).

TEST EXAMPLE 2

The emission measurements of $(Sr_{1-x}Mn_x)_8Al_{12}O_{24}S_2$ phosphors were performed by using a Spex Fluorolog-3 spectrofluorometer (Instruments S.A., Edison, N.J., USA) equipped with a 450 W Xe light source and double excitation monochromators. In addition, a DT-100 Color Analyzer was used for the measurement of CIE chromaticity coordinates (x, y).

Figure 5:
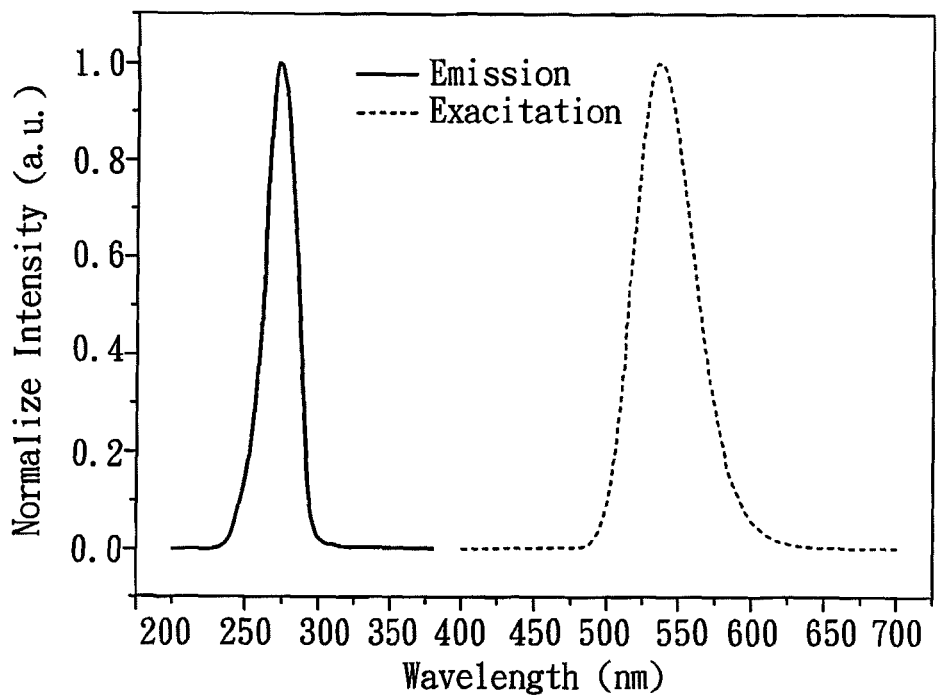
FIG. 5 shows the photoluminescence (PL) and photoluminescence excitation (PLE) spectra of $(Sr_{0.99}Mn_{0.01})_8Al_{12}O_{24}S_2$ prepared by the preparation example 15 according to the present invention.

FIG. 5 shows the photoluminescence (PL) and photoluminescence excitation (PLE) spectra of $(Sr_{0.99}Mn_{0.01})_8Al_{12}O_{24}S_2$ phosphor. It shows that the excitation wavelength is about 254 nm and the emission wavelength is about 538 nm for $(Sr_{1-x}Mn_x)_8Al_{12}O_{24}S_2$ phosphor. Additionally, the CIE chromaticity coordinate of $(Sr_{0.99}Mn_{0.01})_8Al_{12}O_{24}S_2$ phosphor is (0.33, 0.67).

TEST EXAMPLE 3

The emission measurements of $(Sr_{1-x}Eu_x)_8Al_{12}O_{24}S_2$ phosphors were performed by using a Spex Fluorolog-3 spectrofluorometer (USA) equipped with a 450 W Xe light source and double excitation monochromators and Hamamatsu Photonics R928 type photomultiplier as a detector. In addition, a DT-100 Color Analyzer was used for the measurement of CIE chromaticity coordinates (x, y).

Figure 6:
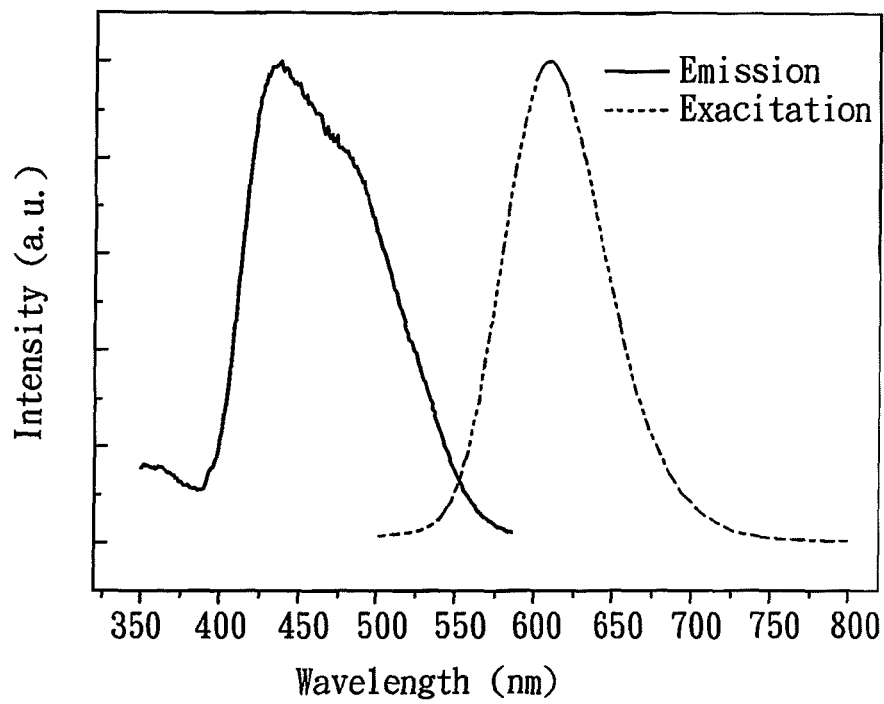
FIG. 6 shows the photoluminescence (PL) and photoluminescence excitation (PLE) spectra of $(Sr_{0.92}Eu_{0.08})_8Al_{12}O_{24}S_2$ phosphor prepared by the preparation example 9 according to the present invention.
Figure 7:
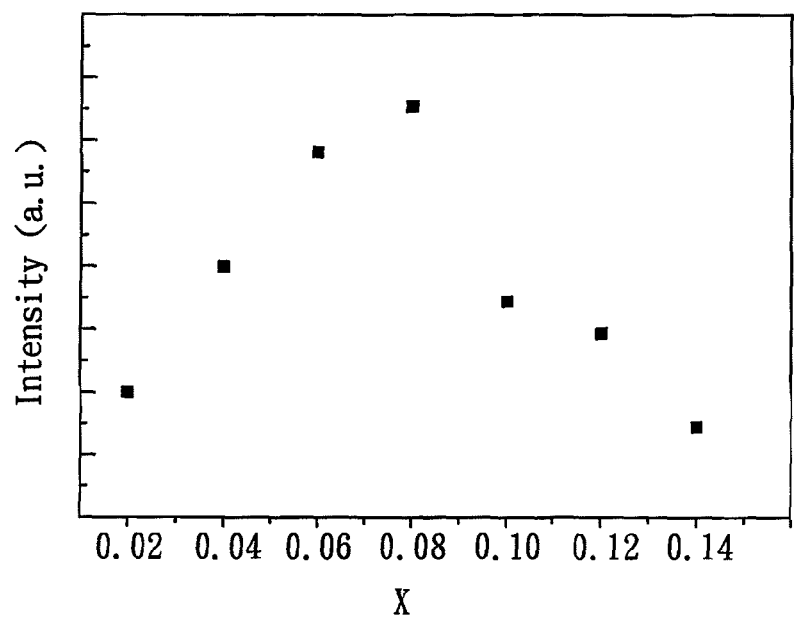
FIG. 7 shows an emission intensity as a function of Eu concentration (x) for $(Sr_{1-x}Eu_x)_8Al_{12}O_{24}S_2$ phosphors prepared by the preparation examples 6-12 according to the present invention.

FIG. 6 shows the photoluminescence (PL) and photoluminescence excitation (PLE) spectra of $(Sr_{0.92}Eu_{0.08})_8Al_{12}O_{24}S_2$ phosphor. It shows that the excitation wavelength is about 450 nm and the emission wavelength is about 605 nm for $(Sr_{1-x}Eu_x)_8Al_{12}O_{24}S_2$ phosphor. FIG. 7 shows an emission intensity as a function of Eu concentration (x) for $(Sr_{1-x}Eu_x)_8Al_{12}O_{24}S_2$ phosphors. Additionally, the CIE chromaticity coordinate of $(Sr_{0.92}Eu_{0.08})_8Al_{12}O_{24}S_2$ phosphor is (0.61, 0.38).

EXAMPLE 1

Figure 8:
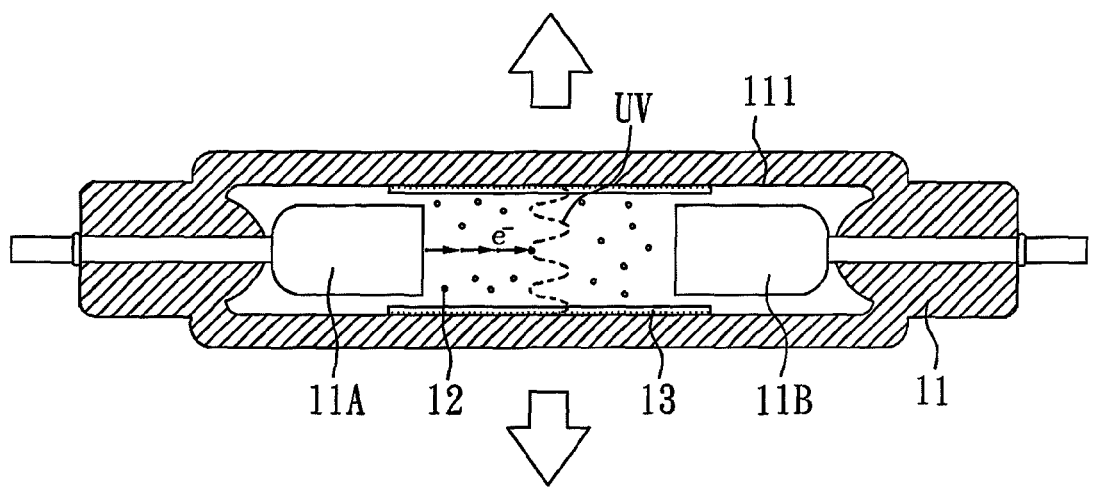
FIG. 8 shows a cross-sectional view of a light-emitting device according to the example 1 of the present invention.

FIG. 8 shows a cross-sectional view of a light-emitting device according to one preferred example of the present invention.

As shown in FIG. 8, the light-emitting device according to the present example includes: a housing body 11 equipped with a cathode electrode 11A and an anode electrode 11B; a discharge medium 12 contained in the housing body 11; and a phosphor layer 13 disposed on an inner wall 111 of the housing body 11. In detail, the light-emitting device provided by the present example is a cold cathode fluorescent lamp, which uses a transparent sealed tube as the housing body 11 to contain the discharge medium 12 therein and to dispose the cathode electrode 11A and the anode electrode 11B at its two terminals. In the light-emitting device according to the present example, mercury and rare gas are used as the discharge medium 12, and the phosphors prepared by the preparation examples 3 and 15 are used in the phosphor layer 13 as a blue phosphor and a green phosphor, respectively. Accordingly, upon a high voltage is applied between the cathode electrode 11A and the anode electrode 11B at both terminals of the housing body 11, electrons will be emitted and accelerated to hit mercury atoms filled in the housing body 11 and thus to excite mercury atoms, such that mercury atoms will emit UV light to excite phosphors in the phosphor layer 13, resulting in the emission of visible light.

EXAMPLE 2

Figure 9:
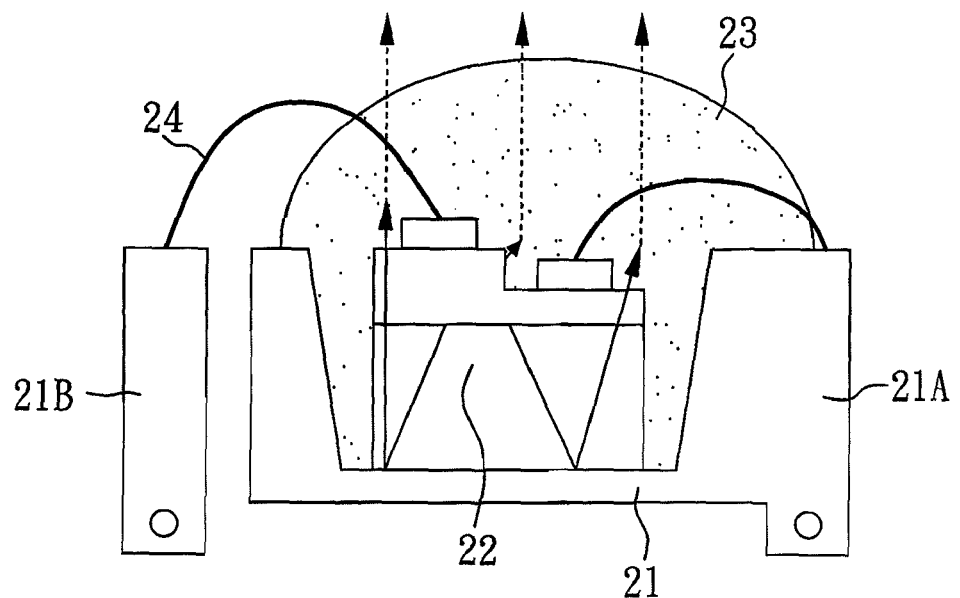
FIG. 9 shows a cross-sectional view of a light-emitting device according to the example 2 of the present invention.

FIG. 9 shows a cross-sectional view of a light-emitting device according to another preferred example of the present invention.

As shown in FIG. 9, the light-emitting device according to the present example includes: a carrier 21; a blue light-emitting component 22 disposed on the carrier 21 and electrically connected with the carrier 21; and a phosphor layer 23 covering the blue light-emitting component 22. In detail, the light-emitting device according to the present example is a white light-emitting diode, which uses a packaging base with lead frames as the carrier 21. Herein, the carrier 21 is provided with a cathode electrode 21A (i.e. a mount lead) and an anode electrode 21B (i.e. an inner lead), and the blue light-emitting component 22 is electrically connected with the cathode electrode 21A and the anode electrode 21B of the carrier 21 via wires 24. Additionally, in the present example, an InGaN-based LED chip capable of emitting light of about 470 nm is used as the blue light-emitting component 22, and the phosphor layer 23 is made of a transparent molding material doped with the yellowish phosphor prepared by the preparation example 9. Accordingly, upon a high voltage is applied between the cathode electrode 21A and the anode electrode 21B of the carrier 21, the blue light-emitting component 22 will be driven and emit blue light to excite the phosphor in the phosphor material layer 23, and then the yellowish light emitted from the phosphor will be mixed with the blue light from the blue light-emitting component 22, resulting in emission of white light.

Figure 10:
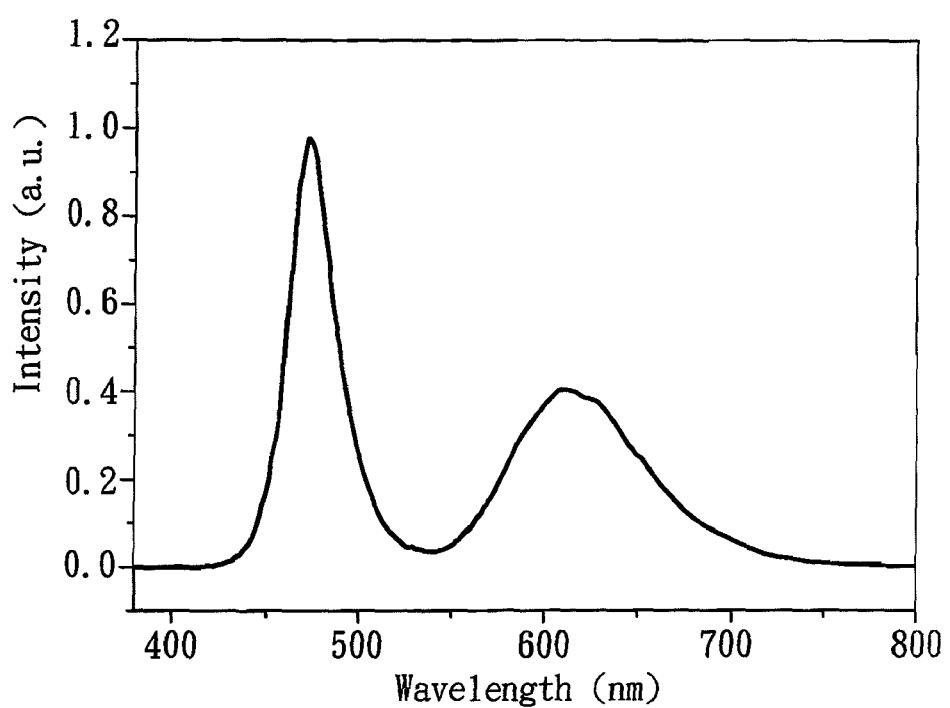
FIG. 10 shows electroluminescence spectra of the light-emitting device according to the example 2 of the present invention.

The measured luminous efficiency of the white LED according to the present example reaches as high as about 14.2 lm/W under 400 mA driving current, as shown in FIG. 10. Additionally, the CIE chromaticity coordinate is (0.34, 0.25), and the correlated color temperature (CCT) is about 4300 K.

EXAMPLE 3

Figure 11:
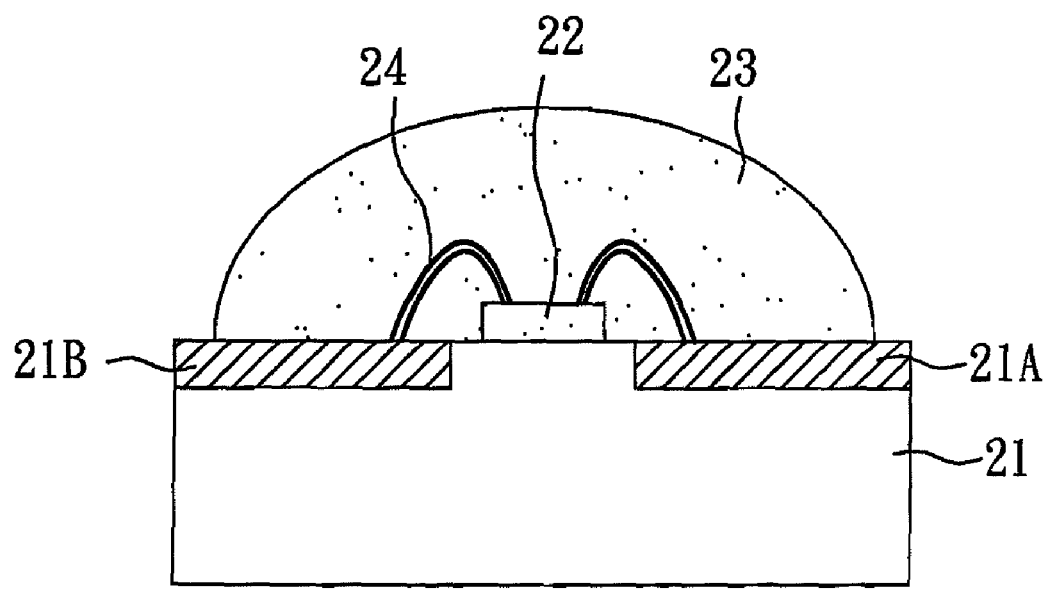
FIG. 11 shows a cross-sectional view of a light-emitting device according to the example 3 of the present invention.

FIG. 11 shows a cross-sectional view of a light-emitting device according to yet another preferred example of the present invention.

As shown in FIG. 11, the light-emitting device according to the present example includes: a carrier 21; a blue light-emitting component 22 disposed on the carrier 21 and electrically connected with the carrier 21; and a phosphor layer 23 covering the blue light-emitting component 22. In detail, the light-emitting device according to the present example is a white light-emitting diode, which uses a circuit substrate as the carrier 21. Herein, the carrier 21 is provided with a cathode electrode 21A and an anode electrode 21B, and the blue light-emitting component 22 is electrically connected to the cathode electrode 21A and the anode electrode 21B of the carrier 21 via wires 24. Additionally, in the present example, an InGaN-based LED chip capable of emitting light of about 470 nm is used as the blue light-emitting component 22, and the phosphor layer 23 is made of a transparent molding material doped with the yellowish phosphor prepared by the preparation example 9. Accordingly, as mentioned in the example 2, the yellowish light from the phosphor material layer 23 would be mixed with the blue light from the blue light-emitting component 22, resulting in emission of white light.

The above examples are intended for illustrating the embodiments of the subject invention and the technical features thereof, but not for restricting the scope of protection of the subject invention. The scope of the subject invention is based on the claims as appended.

What is claimed is:

1. A phosphor represented by a chemical formula of $(A_{1-x}M_x)_8D_{12}O_{24}S_2$, wherein
   $0<x<1$;
   A is selected from the group consisting of Mg, Ca, Sr, Ba, Zn and a combination thereof;
   M is selected from the group consisting of Mn, Cu, Ag, Pb, Sb, Sn, Bi, Eu, Ce, Tb, Sm, Pr, Y, La, Gd, Lu, Sc, Nd, Pm, Dy, Ho, Er, Tm, Yb and a combination thereof; and
   D is selected from the group consisting of B, Al, Ga, In and a combination thereof.

2. The phosphor as claimed in claim 1, wherein A is Ca, Sr or a combination thereof, M is Mn and $0<x<0.05$.

3. The phosphor as claimed in claim 2, wherein $0.0025 \leq x \leq 0.02$.

4. The phosphor as claimed in claim 1, wherein A is Sr, M is Eu and $0<x<0.3$.

5. The phosphor as claimed in claim 4, wherein $0.02 \leq x \leq 0.14$.

6. A light-emitting device, comprising:
   an excitation unit for providing excitation light; and
   a phosphor layer capable of emitting visible light upon being excited by the excitation light, therewith the phosphor layer comprising a phosphor represented by a chemical formula of $(A_{1-x}M_x)_8D_{12}O_{24}S_2$, wherein
   $0<x<1$;
   A is selected from the group consisting of Mg, Ca, Sr, Ba, Zn and a combination thereof;
   M is selected from the group consisting of Mn, Cu, Ag, Pb, Sb, Sn, Bi, Eu, Ce, Tb, Sm, Pr, Y, La, Gd, Lu, Sc, Nd, Pm, Dy, Ho, Er, Tm, Yb and a combination thereof; and
   D is selected from the group consisting of B, Al, Ga, In and a combination thereof.

7. The light-emitting device as claimed in claim 6, wherein the excitation unit is an UV excitation unit.

8. The light-emitting device as claimed in claim 7, wherein A is Ca, Sr or a combination thereof, M is Mn and $0<x<0.05$.

9. The light-emitting device as claimed in claim 8, wherein $0.0025 \leq x \leq 0.02$.

10. The light-emitting device as claimed in claim 7, wherein the excitation light ranges from 250 nm to 300 nm in wavelength.

11. The light-emitting device as claimed in claim 7, wherein the UV excitation unit comprises: a housing body provided with a cathode electrode and an anode electrode, therewith the phosphor layer being disposed on an inner wall of the housing body; and a discharge medium contained in the housing body for emitting the excitation light.

12. The light-emitting device as claimed in claim 6, wherein the excitation unit is a blue excitation unit.

13. The light-emitting device as claimed in claim 12, wherein A is Sr, M is Eu and $0<x<0.3$.

14. The light-emitting device as claimed in claim 13, wherein $0.02 \leq x \leq 0.14$.

15. The light-emitting device as claimed in claim 12, wherein the excitation light ranges from 420 nm to 490 nm in wavelength.

16. The light-emitting device as claimed in claim 12, wherein the blue excitation unit comprises: a carrier provided with a cathode electrode and an anode electrode; and a blue light-emitting component disposed on the carrier and electrically connected with the cathode electrode and the anode electrode, therewith the phosphor layer covering the blue light-emitting component.

17. The light-emitting device as claimed in claim 16, wherein the carrier is a circuit substrate or a packaging base with lead frames.

\* \* \* \* \*